(12) United States Patent
Becker et al.

(10) Patent No.: US 6,701,498 B2
(45) Date of Patent: Mar. 2, 2004

(54) BLACK BOX TIMING MODEL FOR LATCH-BASED SYSTEMS

(75) Inventors: Matthew Becker, Maxwell AFB, AL (US); Chen Li Lin, Burlington, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 1 day.

(21) Appl. No.: 10/008,930

(22) Filed: Nov. 8, 2001

(65) Prior Publication Data

US 2003/0088838 A1 May 8, 2003

(51) Int. Cl.[7] ............................................... G06F 17/50
(52) U.S. Cl. ................................................ 716/6; 716/5
(58) Field of Search ............................. 716/1, 4–6, 18; 703/19

(56) References Cited

U.S. PATENT DOCUMENTS

| | | | |
|---|---|---|---|
| 4,924,430 A | * 5/1990 | Zasio et al. | 716/6 |
| 5,095,454 A | 3/1992 | Huang | |
| 5,323,401 A | 6/1994 | Maston | |
| 5,355,321 A | * 10/1994 | Grodstein et al. | 716/6 |
| 5,392,227 A | 2/1995 | Hiserote | |
| 5,452,239 A | * 9/1995 | Dai et al. | 703/19 |
| 5,508,937 A | 4/1996 | Abato et al. | |
| 5,740,347 A | * 4/1998 | Avidan | 716/6 |
| 5,790,830 A | 8/1998 | Segal | |
| 6,023,568 A | 2/2000 | Segal | |
| 6,041,169 A | 3/2000 | Brennan | |
| 6,058,252 A | 5/2000 | Noll et al. | |
| 6,185,723 B1 | 2/2001 | Burks et al. | |
| 6,223,333 B1 | 4/2001 | Kuribayashi et al. | |
| 6,230,115 B1 | 5/2001 | Ohsaki et al. | |
| 6,237,127 B1 | 5/2001 | Craven et al. | |
| 6,378,113 B1 | 4/2002 | Levitsky et al. | |
| 6,405,348 B1 | 6/2002 | Fallah-Tehrani et al. | |

OTHER PUBLICATIONS

Tang, T., and Zhou, X., "A Dynamic Timing Delay for Accurate Gate–level Circuit Simulation," <http://www.ntu.edu.sg/eee/eee6/LectureNotes/pub/MWSCAS96.pdf>, printed on Jun. 17, 2002.
"Using the XC9500 Timing Model," <http://www.xilinx.com/xapp/xapp071.pdf>, printed Jun. 17, 2002.
"MPCP–Timing Model," <http://grouper.ieee.org/groups/802/3/efm/public/mar02/haran_1_0302.pdf>, printed Jun. 17, 2002.
"#PSPA019: What will digital worst–case timing simulation do for you?," <http://www.pspice.com/upload/appnotes/PSPA019.html>, printed Jun. 17, 2002.

* cited by examiner

Primary Examiner—Vuthe Siek
Assistant Examiner—Paul Dinh
(74) Attorney, Agent, or Firm—Kilpatrick Stockton LLP

(57) ABSTRACT

A method of creating a black box timing model for a digital circuit. The digital circuit is characterized by a block model having at least one input and at least one output. The method determines a delay statement for the output of the block model. The method also determines an input set-up constraint for the input of the block model. The input set-up constraint is based upon the delay statement. The model is then used with a static timing analyzer to accurately model a flow-through circuit.

28 Claims, 13 Drawing Sheets d->q = clk->q = 100
setup = 100

Timing Model:
setup in clock v 360 360
    where "v" = falling edge of clock
    "360 360" = rising setup and falling setup delay clock ^ out 660 660
    where "^" = rising edge of clock and
    "660 660" = rising delay and falling delay input delay = 80 + 100 + 80 + 100 = 360
output delay = 100 + 480 - 500 + 100 + 480 = 660

FIG. 5

Determine delay statement
\#         1) set all inputs early: forces no time borrowing
\#         2) set output constraints for B latch on all pins: allows constraint
\#                 check against the output pin with B => outputs begin tighter
\#                         a) run constraint checker for each pin
\#                         b) worst case path for each edge sets the delay statement
\#         3) quit
Repeat w A constraints => A outputs will be tighter
Repeat both A and B with new output cap

Set inputs early and constraints to nominal (individually)
Input * clock ^ -1000 -1000 -1000 -1000
Constrain_node <outputs> clock ^ 0 0 0 0
\# loop on each output pin
        Find_all_paths_from_node out_balat
        Report
Quit run with other edge constraint
Input * clock ^ -1000 -1000 -1000 -1000
Constrain_node <outputs> clock v 0 0 0 0
loop on each output pin
        Find_all_paths_from_node out_balat
        ReportPaths

Re-run with different output load

FIG. 6

Determine setup statement
1) set output constraints to delay value for given load: ensures that
input arrival times do not affect output times (as good as no ft)
2) set all inputs late: forces time borrowing
a)run constraint checker for each input pin
b) look at all possibility: reduce violation
c) reorder based on corrected violation time
d) worst case path sets the input setup constraint

Re-run with B type inputs
Re-run with different input slew

Set inputs late and constraints to actual (individually)
Input * clock ^ 1000 1000 1000 1000
Constrain_node <outputs> clock ^ -87 -87 -87 -87
loop on each input pin
            Find_all_paths_from_node in_balat
            ReportPaths
quit run with other clock edge input
Input * clock v 1000 1000 1000 1000
Constrain_node <outputs> clock ^ -87 -87 -87 -87
loop on each input pin
            Find_all_paths_from_node in_balat
            ReportPaths

Repeat with new input slews

Timing Model:
  setup in clock v 360 360
  delay clock ^ out 660 660 input delay = 80 + 100 + 80 + 100 = 360
output delay = 100 + 480 − 500 + 100 + 480 = 660 relaunch delay = 80 + 100 = 180
cycle-adjusted delay = 80 − 500 + 100 + 480 − 500 + 100 + 480 = 240

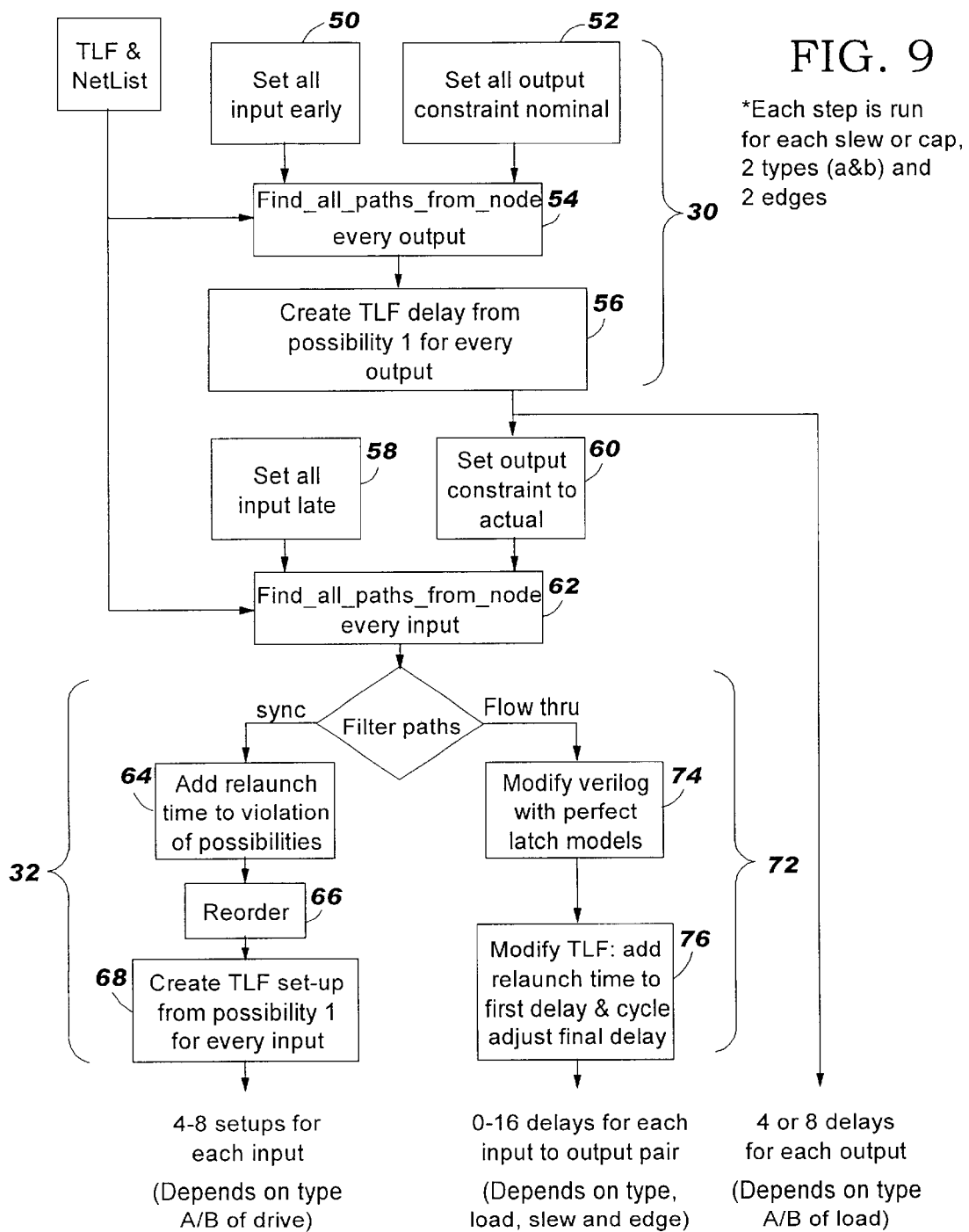

FIG. 11A

```
Cell(perfect_delay_cell
        Celltype(comb)
        Pin(in Pintype(data) Pindir(input))
        Pin(out Pintype(data) Pindir(output))
        Model(one_phase (const(phase)))
        Model(linear_slew)
        (Spline
                (Input_Slew_Axis 0.1 0.2 0.4 0.6 0.8 1.0 1.5 3.0)
                        data (      (0.1 0.2 0.4 0.6 0.8 1.0 1.5 3.0))
                )
        )
Path(in => out 01 01 Delay (one_phase) Slew(linear_slew))
Path(in => out 10 10 Delay (one_phase) Slew(linear_slew))
)

Cell(perfect_a_latch
        Celltype(Seq)
        Pin(clock Pintype(clock high) Pindir(input))
        Pin(d_b Pintype(Data) Pindir(input))
        Pin(q_a Pintype(Data) Pindir(output))
Latch(
        Output(q_a)
        Input(d_b)
        Clock(clock)
)
Model(zero(const(0))))
Model(linear_slew
(Spline
        (Input_Slew_Axis 0.1 0.2 0.4 0.6 0.8 1.0 1.5 3.0)
        data (         (0.1 0.2 0.4 0.6 0.8 1.0 1.5 3.0))
        )
)
Path(d_b => q_a 01 01 Delay(zero) Slew(linear_slew))
Path(d_b => q_a 10 10 Delay(zero) Slew(linear_slew))
)

Cell(perfect_b_latch
        Celltype(Seq)
        Pin(clock Pintype(clock low) Pindir(input))
        Pin(d_b Pintype(Data) Pindir(input))
        Pin(q_a Pintype(Data) Pindir(output))
        Latch(
                Output(q_b)
                Input(d_a)
                Clock(clock)
```

FIG. 11B

)
Model(zero(const(0))))
Model(linear_slew)
(Spline
    (Input_Slew_Axis 0.1 0.2 0.4 0.6 0.8 1.0 1.5 3.0)
    data (      (0.1 0.2 0.4 0.6 0.8 1.0 1.5 3.0))
    )
)
Path(d_a =>q_b 01 01 Delay(zero) Slew(linear_slew))
Path(d_a =>q_b 10 10 delay (zero) Slew(linear_slew))
)

```
module ab_section (in, clock, out);
        input in;
        input clock;
        output out;

wire net0, net1;

perfect_a_latch i0 (.clock(clock), .d_b(in), .q_a(net0));
        perfect_delay_cell i1(.in(net0), .out(net1));
        perfect_b_latch i2(.clock(clock), .d_a(net1), .q_b(out));

endmodule
```

Actual Path

Black Box Model of Path

STA 1st Latch: A 500, B 250    500
Calculated Relaunch Time
Corrected pin launch time Relaunch Adjusted Delay    200

STA: Delay between output & last relaunch latch    200
# of intervening latch    −250

Cycle Adjusted Delay    −50

BLACK BOX TIMING MODEL FOR LATCH-BASED SYSTEMS

BACKGROUND OF THE INVENTION

1. Field of the Invention

This invention generally relates to computer-aided design of integrated circuits and, more particularly, to methods for verifying the timing behavior of digital circuits.

2. Description of the Related Art

The current processes for designing custom digital circuits often hampers further improvements in cost and speed. Manufacturing was once the pinch-point in the development of large, custom digital circuits. Today, however, sub-micron manufacturing technologies allow millions, or even tens of millions, of gates to be reliably manufactured on larger wafers. The bottleneck is now very often the design process itself. System designers, for example, are forced to make global tradeoffs when selecting and configuring logic and memory cores. These tradeoffs greatly affect both performance and cost of the final design. Once these global architectural decisions are made, a more detailed design process follows, where the design is mapped and performance, chip size, and power objectives are achieved. As designs shrink to accommodate ever more gates and features, design verification becomes a more complicated process and a more pressing concern.

Verification is performed in a hierarchical manner. Circuit designs are partitioned into hierarchical blocks. Groups of circuit designers are then responsible for the design and for the implementation of each block. Higher level blocks are designed at higher levels of abstraction. As the design process continues, lower level sub-blocks use lower levels of abstraction—logic level, then circuit level, then layout level—until an eventual manufacturing release. The design of each sub-block must be verified to ensure the performance targets of higher blocks, and the global circuit design, are achieved.

If a hierarchical block is a flop-based design, verification has been accurately implemented. Because each path within the block ends at a flop device, a timing model of the block is simply achieved. The timing model consists of one delay number for each output pin and one setup constraint number on each input pin. One caveat to this simple model, however, is purely combinational paths from inputs to outputs. Another caveat is that the "one number" for each pin is actually a table of numbers for different possible slews and loads.

Producing realistic timing abstracts for latch-based blocks, however, has encountered several problems. One problem has been a loss of information between hierarchical blocks. Because custom circuit designs have millions of gates, circuit designers want to maintain as much information as possible between each hierarchical block. Because, however, higher levels of blocks are abstract versions of sub-blocks, valuable and necessary information is currently lost in the hierarchical, abstract design process for latch-based designs. Circuit designers then attempt various "corrections" to compensate for the information lost in a sub-block analysis. These corrections, however, often introduce excessive pessimism in the next hierarchical level, thus thwarting the creation of a realistic timing abstract. Another problem has been a lack of data compression for latch paths. Current methods may require entirely revealing a latch path within a block. Designers, however, often cannot reveal each latch path during the abstract, hierarchical design process. Blocks are then treated as boundaries and time borrowing is not allowed into or out of the block.

There are still other problems when creating accurate timing models of latch-based systems. Because a latch path may be multiple latches deep, another problem is determining a worst case set-up and launch relative to clock points inside the block. A further problem is that latch paths often time borrow all the way through a block to an output pin, thus making output times dependent upon input arrival times.

There is, accordingly, a need in the art for methods that create realistic timing abstracts for latch-based blocks in a hierarchical design process, methods that lose as little information as possible between hierarchies, methods that are accurate without introducing excessive pessimism, and methods that are simple to use and quick to implement.

BRIEF SUMMARY OF THE INVENTION

The aforementioned problems are minimized by the present invention. The present invention describes methods of creating timing models for digital circuits. These methods allow hierarchical circuit blocks to be treated as "black boxes" for timing analysis purposes. Because the present invention treats a circuit block as a black box, designers do not need to reveal latch paths within the block. Designers, for example, do not have to know how many latches are in a path. Designers, in fact, need to know very little about the circuit contents of a block.

The present invention will reveal set-ups and delays for a new block. The methods of the present invention determine a delay statement for an output of a black box model of the digital circuit. The methods also determine an input set-up constraint for an input of the black box model. This input set-up constraint, however, is based upon the delay statement. Constraints on any output pins are thus based upon the calculated delay numbers. Any necessary input arrival times are then determined such that any internal constraints are met. The circuit block is thus characterized by the delay statements and the input set-up constraints. Details of latch paths within the block are not necessary when revealing these set-up constraints and delays.

The present invention thus creates accurate timing abstracts of latch-based blocks. Because the block is characterized by the delay statements and the input set-up constraints, little or no information is lost at higher levels. Circuit designers are now assured of greater accuracy at each level of design. Designers can also quickly analyze the timing of larger blocks with greater numbers of input and output pins. The improved accuracy offered by the present invention means circuit performance targets are achieved faster, late design changes are reduced, and circuit masks have higher confidences.

BRIEF DESCRIPTION OF THE SEVERAL VIEWS OF THE DRAWINGS

These and other features, aspects, and advantages of the present invention are better understood when the following Detailed Description of the Invention is read with reference to the accompanying drawings, wherein:

FIG. 5 is an excerpt of a generic static timing analyzer command file for determining a delay statement;

FIG. 6 is an excerpt of a generic static timing analyzer command file for determining an input set-up constraint;

FIG. 9 is a flowchart describing an alternative method of creating a timing model for a digital circuit;

FIG. 11 is a timing library format description of "perfect" latch model sections.

DETAILED DESCRIPTION OF THE INVENTION

Figure 1:
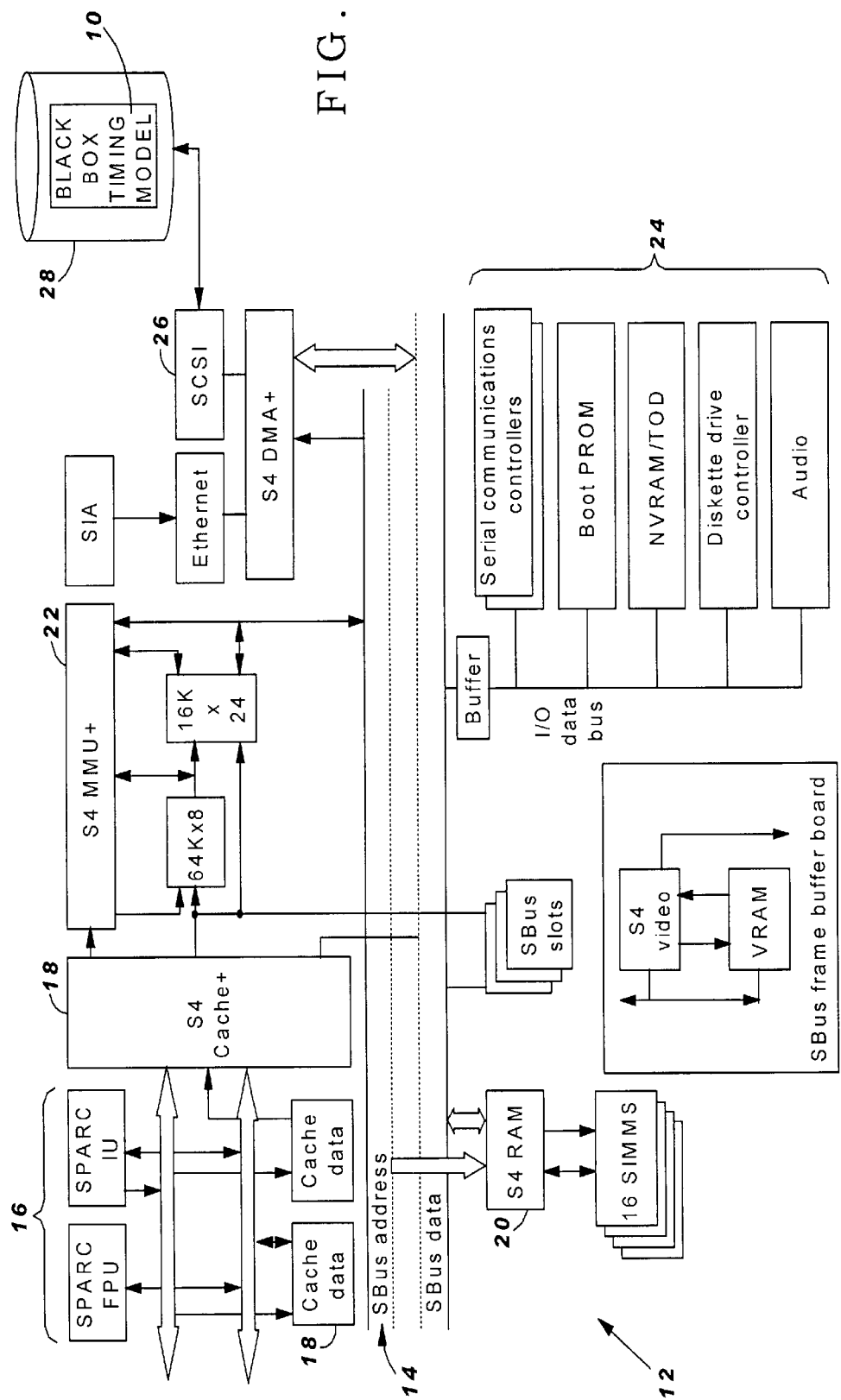
FIG. 1 depicts a possible operating environment for one embodiment of the present invention.

The present invention includes methods, computer systems, and computer program products that model the timing behavior of digital circuits. This patent document is written using concepts and terms in the art of digital circuit design. For those readers unfamiliar with these concepts and terms of art, the following sources and definitions are used when describing the present invention:

A "latch" is a digital memory element wherein an output depends upon a past input. Latches are common elements in digital design, so the reader may consult EDWARD J. MCCLUSKEY, LOGIC DESIGN PRINCIPLES 275–312 (1986), incorporated herein by reference, for more information.

An "A" latch holds its value, or is "opaque," when a clock signal is low. When the clock signal is high, the "A" latch passes a value or is "transparent."

A "B" latch, on the other hand, is opaque when the clock signal is high and transparent when the clock signal is low.

A "sync" or a "synchronization point" is any point where the clock signal initiates subsequent data transitions. A latch in which data is setup to the evaluating clock edge, including skew and set-up requirements, is a "sync point." No data transitions before the sync point affect the logic path after the sync point. A critical path within a block, therefore, need only include a logic path between two sync points.

A latch is "flow-through" when the latch is transparent and while a clock signal is stable.

"Set-up time" or "set-up constraint" is the amount of time an input to a latch must arrive before the clock edge arrives.

"Time borrowing" describes situations where logic devices require more than one clock cycle to compute a value. A latch path, for example, may comprise several portions of latches separated by combinational logic. One portion may require less than a full clock cycle to compute a value, while another portion requires more than a full clock cycle. Because latches are active while the clock is high (or low), one portion requiring more than a clock cycle may "borrow" time from an adjacent portion not requiring a full clock cycle.

One embodiment of the present invention describes a method of creating a timing model for a digital circuit. The method determines a delay statement for an output of a black box model of the digital circuit. The method also determines an input set-up constraint for an input of the black box model. Once the delay statement and the input set-up constraint are determined, this timing model is then used by a generic static timing analyzer. The generic static timing analyzer applies input arrival times and then prunes all but the worst case output arrival time. The result is that flow-through circuits are accurately modeled.

Another embodiment discloses an alternative method of creating a timing model for a digital circuit. This alternative embodiment sets an input to discourage time borrowing, sets an output constraint to nominal, and creates a delay. The alternative embodiment then sets an input to encourage time borrowing, sets an output constraint to reduce an effect of input arrival time on output time, and sums a relaunch time and a violation time. An input set-up constraint is then selected from a corrected constraint violation time.

Still a further embodiment describes another method of creating a black box timing model for a digital circuit. This method allows time borrowing into a black box circuit model of the digital circuit and allows time borrowing out of the black box circuit model. The method also allows time borrowing on a path within the black box circuit model, but this time borrowing is only permitted up to a worst-case delay. This method, however, does not allow output timing to depend upon an input arrival time, so the output timing is independent of input arrival timing. The output timing, therefore, is based upon a synchronous path originating from a clock somewhere within the black box circuit model. If a path from some other input, having a fast delay, fans into the same output, this fast-delay input set-up constraint is set large enough to ensure the fast path does not affect output timing. Not every input, therefore, must synchronize somewhere within the black box circuit model.

Another embodiment discloses a computer system for creating a timing model of a digital circuit. The computer system comprises a central processor unit and a timing model stored in a memory device of the computer system. The timing model determines a delay statement for an output of a black box model of a digital circuit. The timing model also determines an input set-up constraint for an input of the black box model. The central processor unit is capable of processing the delay statement and the input set-up constraint and of generating timing behavior of the digital circuit.

Still another embodiment of the present invention describes a computer program product for creating a timing model of a digital circuit. This computer program product comprises a computer-readable medium and a timing model stored on the computer-readable medium. The timing model determines a delay statement for an output of a black box model of the digital circuit. The timing model also determines an input set-up constraint for an input of the black box model. The computer program product may then be used to accurately model flow-through latch-based digital circuits.

FIG. 1 depicts a possible operating environment for one embodiment of the present invention. This embodiment of a black box timing model 10 comprises a computer program that acquires information and verifies the timing behavior of digital circuits. As those of ordinary skill in the art of computer programming recognize, computer processes/programs are depicted as process and symbolic representations of computer operations. Computer components, such as a central processor, memory devices, and display devices, execute these computer operations. The computer operations include manipulation of data bits by the central processor, and the memory devices maintain the data bits in data structures. The process and symbolic representations are understood, by those skilled in the art of computer programming, to convey the discoveries in the art.

FIG. 1 is a block diagram illustrating this possible operating environment for the present invention. FIG. 1 shows the black box timing model 10 residing within a computer system 12. The computer system 12 includes a bus 14 communicating information between a central processor unit 16, cache memory 18, Random Access Memory 20, a Memory Management Unit 22, one or more input/output controller chips 24, and a Small Computer System Interface (SCSI) controller 26. The SCSI controller 26 interfaces with SCSI devices, such as mass storage hard disk drive 28. The black box timing model 10 is shown stored within the mass storage hard disk drive 28, although those of ordinary skill in the art recognize the black box timing model 10 could reside and operate within one or more memory devices. Those of ordinary skill in the art also understand that the program, processes, methods, and systems described in this patent are not limited to any particular computer system or computer hardware.

Those of ordinary skill in the art also understand the central processor unit 16 is typically a microprocessor. Sun Microsystems, for example, designs and manufactures high-end 64-bit and 32-bit microprocessors for networking and intensive computer needs (Sun Microsystems, Inc., 901 San Antonio Road, Palo Alto Calif. 94303, www.sun.com). Advanced Micro Devices (Advanced Micro Devices, Inc., One AMD Place, P.O. Box 3453, Sunnyvale, Calif. 94088-3453, 408.732.2400, 800.538.8450, www.amd.com) and Intel (Intel Corporation, 2200 Mission College Blvd., Santa Clara, Calif. 95052-8119, 408.765.8080, www.intel.com) also manufacture various families of microprocessors. Other manufacturers include Motorola, Inc. (1303 East Algonquin Road, P.O. Box A3309 Schaumburg, Ill. 60196, www.Motorola.com), International Business Machines Corp. (New Orchard Road, Armonk, N.Y. 10504, (914) 499-1900, www.ibm.com), and Transmeta Corp. (3940 Freedom Circle, Santa Clara, Calif. 95054, www.transmeta.com). While only one microprocessor is shown, those skilled in the art also recognize multiple processors may be utilized. Those skilled in the art further understand that the program, processes, methods, and systems described in this patent are not limited to any particular manufacturer's central processor.

The preferred operating system is the SOLARIS™ operating system (SOLARIS™ is a registered trademark of Sun Microsystems, Inc.). Those skilled in the art also recognize many other operating systems are suitable. Other suitable operating systems include UNIX® (UNIX® is a registered trademark of the Open Source Group, www.opensource.org), Linux, WINDOWS® and WINDOWS NT® (WINDOWS® and WINDOWS NT® are registered trademarks of Microsoft Corporation, One Microsoft Way, Redmond Wash. 98052-6399, 425.882.8080, www.Microsoft.com), and Mac® OS (Mac® is a registered trademark of Apple Computer, Inc., 1 Infinite Loop, Cupertino, Calif. 95014, 408.996.1010, www.apple.com). Those of ordinary skill in the art again understand that the program, processes, methods, and systems described in this patent are not limited to any particular operating system.

Figure 2:
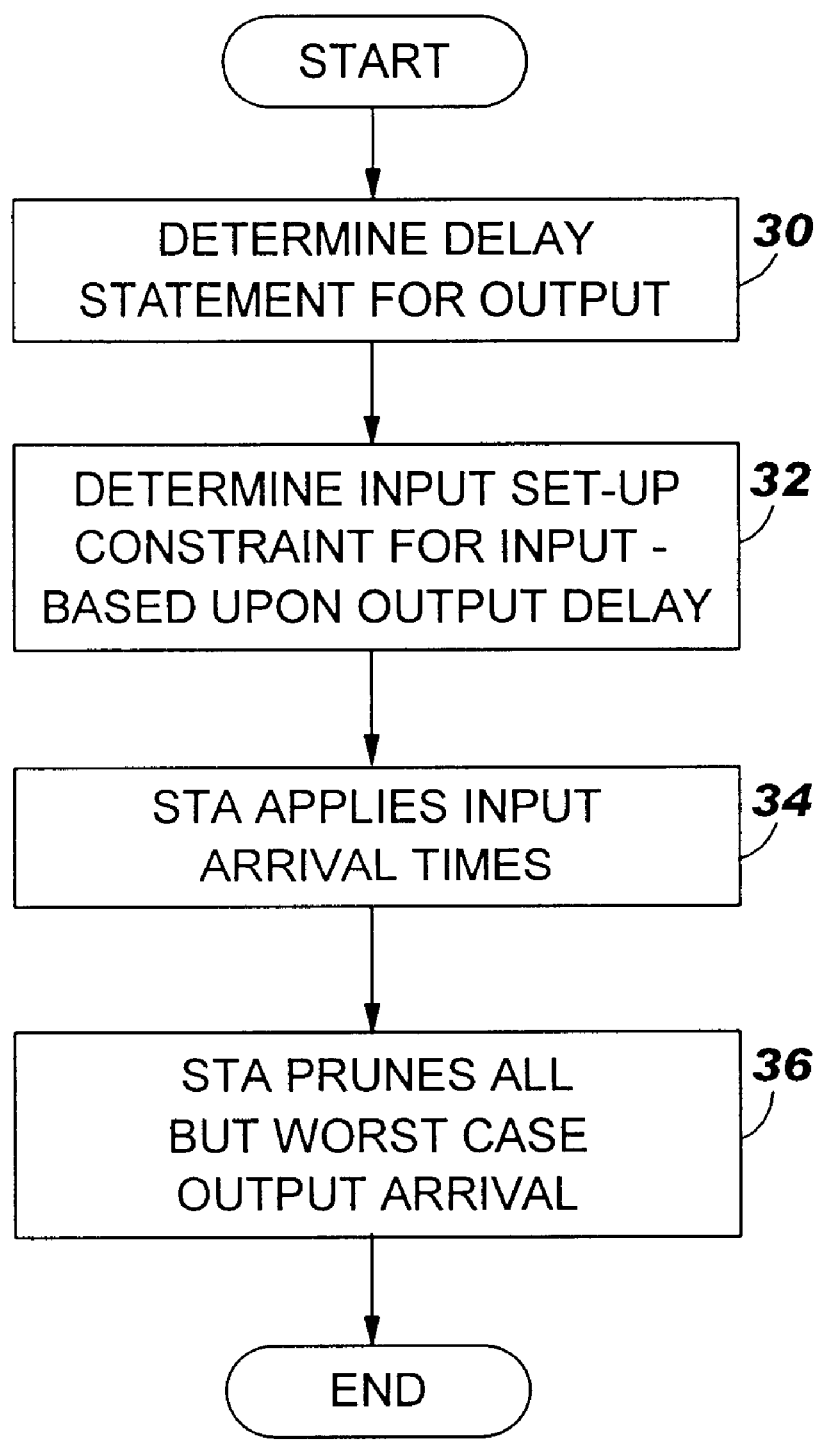
FIG. 2 is a flowchart showing a method of creating a timing model for a digital circuit.

FIG. 2 is a flowchart showing a method of creating a timing model for a digital circuit. The method determines a delay statement (Block 30) for an output of a black box model of the digital circuit. The method also determines an input set-up constraint (Block 32) for an input of the black box model. Once the delay statement and the input set-up constraint are determined, this timing model is then used by a generic static timing analyzer. The generic static timing analyzer applies input arrival times (Block 34) and then prunes (Block 34) all but the worst case output arrival time. The result is that flow-through circuits are accurately modeled.

The method shown in FIG. 2 is applicable to two types of black box models. The first type of black box model is a "pseudo-flop" style model, while the second type of black box model is a true "latch" style model. Each of the black box models will be discussed in a detailed subsection.

The "Pseudo-Flop" Style Model

The "pseudo-flop" style model allows little or no worst case time borrowing. This "pseudo-flop" style model is used in top-level blocks through which time borrowing is discouraged. Time borrowing is allowed into the block, time borrowing is allowed out of the block, and time borrowing is allowed on paths up to a worst case delay. The output timing, however, is not permitted to depend upon any input arrival time. Because the output timing is independent of input timing, the output timing is based upon a synchronous path originating from a clock within the block. If a path from some other input, with a fast delay, fans into the same output pin, the set-up constraint for this fast-delay is set large enough to ensure the fast path has little or no effect on output timing. Not every input, therefore, must synchronize somewhere within the block. This distinction bounds the model to either known sources or known destinations inside the block. If both a source and a destination are not known, then the number of cycles through the block cannot be accurately modeled at a next level.

Figure 3:
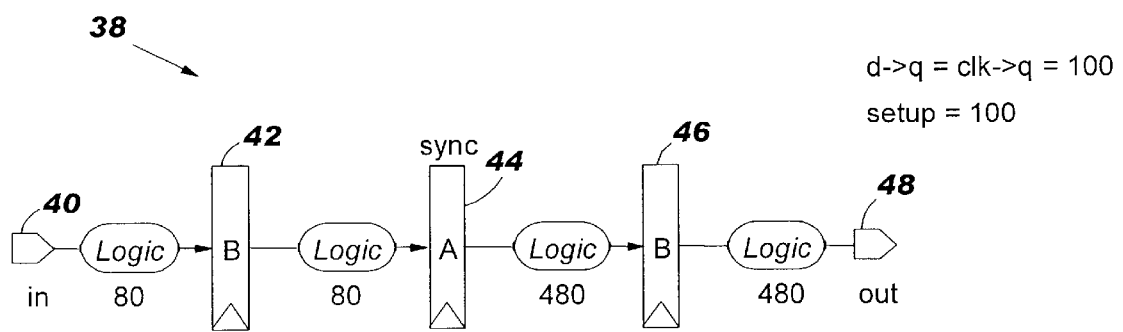
FIG. 3 is a schematic drawing of one example of a "pseudo-flop" style model.

FIG. 3 is a schematic drawing of one example of a "pseudo-flop" style model 38 given a one nanosecond (ins) cycle time. This "pseudo-flop" style model 38 has a sequence of latches separated by combinational logic. The "pseudo-flop" style model 38 includes an input 40, a first latch 42, a second latch 44, a third latch 46, and an output 48. One may calculate a worst case output arrival time and insert a timing library format (TLF) delay from clock to the output 48. If the second latch 44, for example, is synchronous, then the delay is 660 picoseconds. If the third latch 46 was, instead, synchronous, the delay would only be 580 picoseconds. If the first latch 42 is synchronous, the latch path would not time borrow through the second latch 44. Notice the output delay drops by one phase going between phases. The set-up time for the input 40 is 360 picoseconds when the second latch 44 is assumed synchronous. A more normal set-up time to meet the transparent window from the input 40 to the first latch 42 would be just 180 picoseconds, to the second latch 44 would be (−80) picoseconds, and to the third latch 46 would be (−60) picoseconds.

Figure 4:
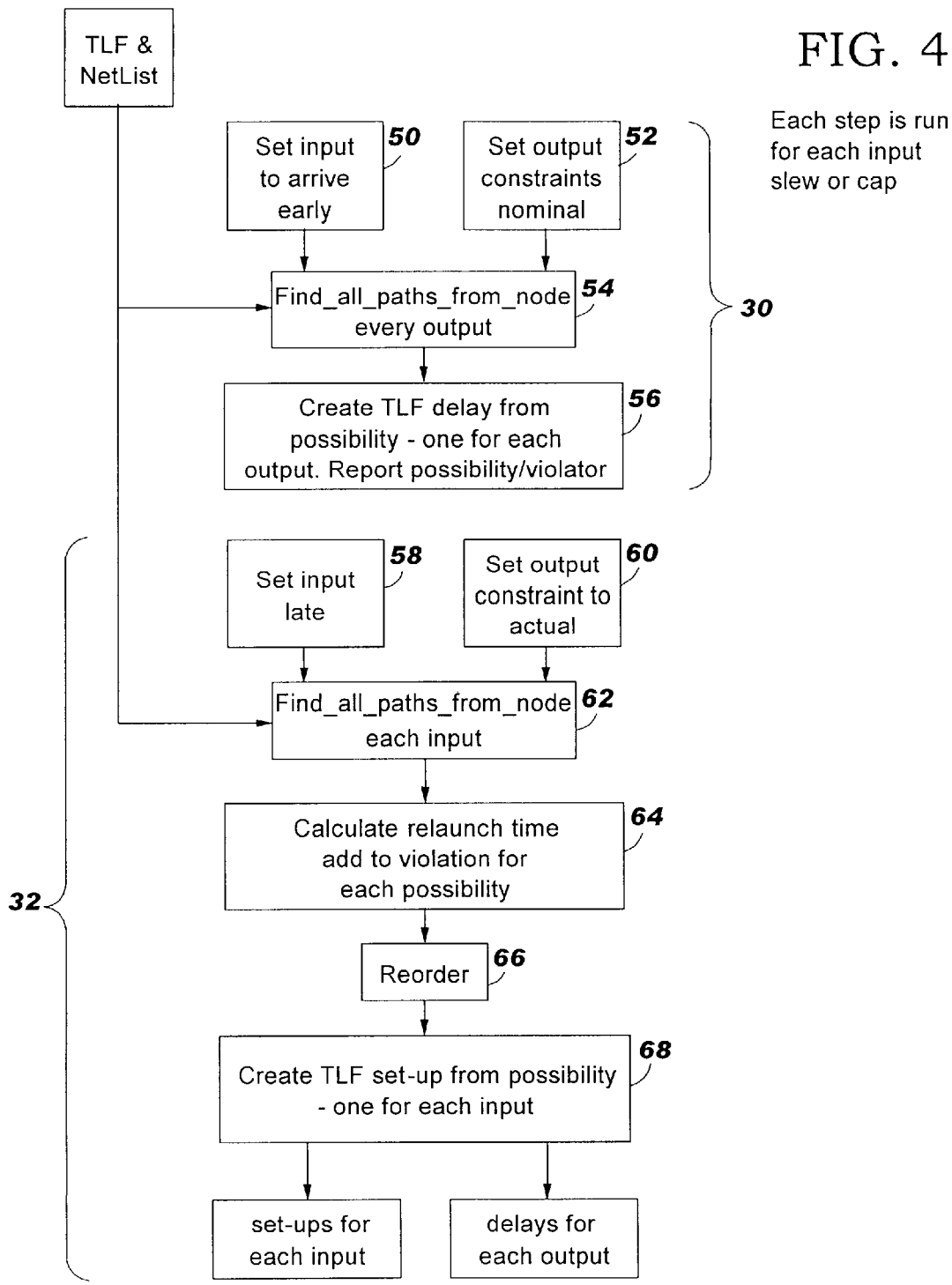
FIG. 4 is a flowchart further describing a method of creating a timing model for a digital circuit.

FIG. 4 is a flowchart further describing a method of creating a timing model for a digital circuit. FIG. 4 shows the step of determining a delay statement (shown as Block 30 in FIG. 2), and the step of determining an input set-up constraint (shown as Block 32 in FIG. 2), may have sub-steps. When the method determines the delay statement, all inputs are set to arrive early (Block 50) to force no time borrowing. All output constraints are set to a nominal value (Block 52). One or more constraints are found for each output (Block 54). The worst case constraint is used to create the delay (Block 56).

As FIG. 4 shows, output delays are used to determine input set-up times. The output delay is used as a constraint when determining the input set-up time. Once an initial output delay for an output is found (Block 56), the timing is known relative to a clock edge. That same output delay may then be used as a set-up time when determining the input set-up for an input to the block. All inputs are set to arrive late (Block 58) and all output constraints are set to actual (Block 60). One or more constraints are found through each input (Block 62). As FIGS. 6–7 will further illustrate, a relaunch time is calculated and added to a violation (Block 64). The corrected violations are then reordered (Block 66) and the timing library format set-up constraint is created (Block 68). FIG. 4 then, like FIG. 2, is essentially a two-step flow: the output delay determination step may guarantee a synchronous point exists somewhere within the block. That output delay is then used as a nominal output set-up time to find an input set-up constraint.

FIG. 5 is an excerpt of a generic static timing analyzer command file for determining the delay statement (shown as Block 30 in FIG. 2). This command file produces a delay statement for a single output pin. This file, therefore, is repeated for each output. The possibility reported will be the worst case violator modulo for the relaunched paths occurring in the block. If a path misses a latch's transparency, the generic static timing analyzer backs that path's delay so the delay makes it through the latch. Such an error is fixed to avoid corrupting following paths with ever-increasing errors. This simplification also makes the static timing analyzer run faster, but with an obvious trade-off in accuracy.

The input timing and constraints are set once per run. The command "Find_all_paths_from_node" is run four (4) times per output pin. A possibility is reported for each data output edge, with the possibility written as a delay statement in a timing library format model. Note that the command "Find_all_paths_from_node" is run for differing output loads, A and B. Because a single output pin may be driven by both a transparent latch (an "A" latch) and an opaque latch (a "B" latch), which is common in custom dynamic circuits, differing loads are required. The different load types expose each type through cycle accounting differences.

Timing library format models usually contain a table of delays for each varying output load and input slew. The black box model of the present invention, however, has no input to output paths; therefore, input slews cannot affect an output. Input slews are thus not included in the determination and result in a 2×increase in runs for a change in output load.

FIG. 6 is an excerpt of a generic static timing analyzer command file for determining the input set-up constraint (shown as Block 32 in FIG. 2). Because violating paths are relaunched, determining the set-up constraints is more difficult. The term "relaunch," as used herein, describes the process of backing up the arrival time of a signal to a latch to meet the setup requirements. Relaunching applies to signals that have missed the transparency window of a given latch. Relaunching allows the circuit designer to evaluate other paths in the design, given that the relaunched path is fixed. The delays, calculated using the method shown in FIGS. 4 and 5, are then applied as output constraints in the output pins of the block. Any necessary input arrival times are then calculated to satisfy both the internal constraints and this new non-flow-through boundary constraint.

The "Find_all_paths_from_node" command is again run for differing output loads, A and B. This procedure captures any input pins that feed both a transparent latch and an opaque latch. The cycle accounting difference may affect the reported set-up constraint. The "Find all paths from_ node" command is run twice the number of input pins. Using the command file shown in FIG. 6, and loading a block with 450 pins, requires 950 "Find_all_paths_from_node" determinations. The two runs may be performed in parallel, but the runs must be serial with the determination of the delay statement shown and described with reference to FIGS. 4 and 5.

One challenge is how the possibilities are ordered relative to how the generic static timing analyzer relaunches paths. There are multiple solutions to this challenge, but one is preferable. i) The simplest procedure would be to set the inputs late, find the worst violation, and "step-back" by that worst violation. Setting a late arrival time, however, exaggerates the violation to the first latches. If the generic static timing analyzer chops off delays during relaunch, this exaggeration will not carry through to the next latches. ii) Another solution is to provide rough input timings from sources external to the block. This solution, of course, requires a very difficult iterative loop encompassing the entire chip and a global-level timing run. iii) Yet another solution initially sets an early input arrival time and iterates until a constraint is violated. A five picosecond (5 ps) iteration, for example, unfortunately requires iterating an undesirably large number of times (iterating the black box flow on the entire block by the difference of worst case and actual requires many iterations—approximately (the number of timing steps per phase)×(3 iterations). iv) Still another solution sets a late (or early) arrival time and finds a first violation (or slack). The arrival time is then shifted to meet the violation (or slack). The "Find_all_paths_from_node" command is then iteratively used with the shifted arrival time. Although this solution converges faster than iii) this solution is still not preferable.

The preferable solution is to use all the possibilities reported. All information is in the report, yet only the violation times are wrong for paths that end in the first latch verses paths that delve into logic. The procedure is to subtract the relaunch time for all the latches in a possibility from the violation time. The paths are then reordered based upon a corrected violation. The required input arrival time is then reported as the worst violator having the greatest delay. Because the generic static timing analyzer need not be reloaded and rerun multiple times, this preferable solution is faster than the solutions discussed in paragraph [0033]. Viewing the possibilities and the data manipulation is also much faster.

Once the input set-up constraints and the output delays are determined, corrections must be made. A relaunch time is first calculated. "Relaunch time" is the difference between the expected output of a latch (e.g., launch+logic+dq) and the output of the latch determined by the generic static timing analyzer. All these numbers are accessible from the possibility. The following equation gives the relaunch time:

$$\text{Relaunch Time}=(\text{time before latch})+dq-(\text{time after latch}).$$

This relaunch time should be a positive number and should be added to the reported violation. Once the relaunch time is added to the violation, a corrected constraint violation is found. The corrected violations are re-ordered, and the real set-up constraint violation is the largest result (or on "top" of the list). This real set-up constraint is then backed to the respective pin. The preferred solution to relaunching would be for the generic static timing analyzer to have a mode in which relaunching may be turned off.

Figure 7:
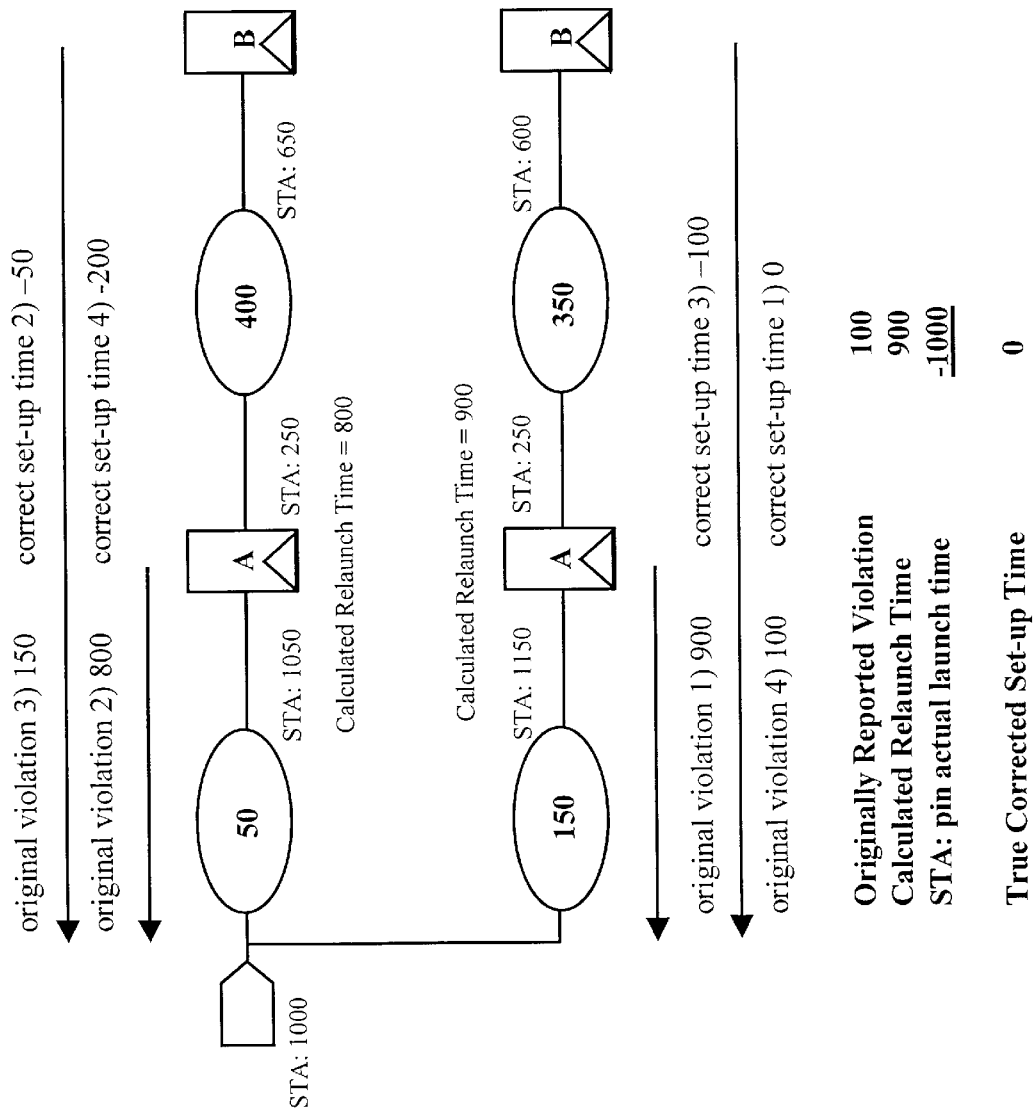
FIG. 7 is a schematic drawing illustrating a two-path example.

FIG. 7 is a schematic drawing of a two-path example. FIG. 7 helps explain how the paths and the four (4) possibilities interact. FIG. 7 shows the original violations, the actual arrival times reported by the generic static timing analyzer, the calculated relaunch time, and the corrected set-up time constraints. The following equation relates the set-up time to the violation amount:

Set-up time=(violation amount)+(relaunch time)−(pin launch time).

FIG. 7 shows the fourth (4$^{th}$) possibility is the actual worst case set-up constraint.

The "Latch" Style Model

FIG. 8 is a schematic drawing of one example of the second type of black box model, the "latch" style model 70. This "latch" style model 70 allows time borrowing through an entire block. The "latch" style model 70 may also be used at either a sub-block level analysis or a block level analysis. While the "latch" style model 70 includes delay and set-up constraints in a timing library format (TLF) (as did the "pseudo-flop" style model 38 shown in and discussed with reference to FIGS. 3–7), the "latch" style model 70 also includes a VERILOG® shell to provide hooks for cycle accounting (VERILOG® is a registered trademark of Cadence Design Systems, Inc., 2655 Seely Avenue San Jose, Calif. 95134). As those of ordinary skill in the art of circuit design recognize, VERILOG® is a hardware description language for designing and documenting electronic circuits.

FIG. 8 also shows the "latch" style model 70 as a sequence of latches separated by combinational logic. The "latch" style model 70 comprises, in this example, the same elements shown in FIG. 3, namely, the input 40, the first latch 42, the second latch 44, the third latch 46, and the output 48. The input 40 gets a set-up constraint relative to the worst internal clocked element. This set-up constraint ensures the signals make the transparent windows inside the block. The output 48 would have a delay statement from a single internal clocked element. The output 48 may also have a path from each input 40. This path comprises an input delay that accounts for relaunching, a VERILOG® section to handle cycle accounting, and an output delay to achieve an overall delay. When this "latch" model is inserted into a static timing analyzer (STA), the STA applies input arrival times and then prunes all but the worst case output arrival time. The result is an accurately modeled flow-through circuit.

Figure 8A:
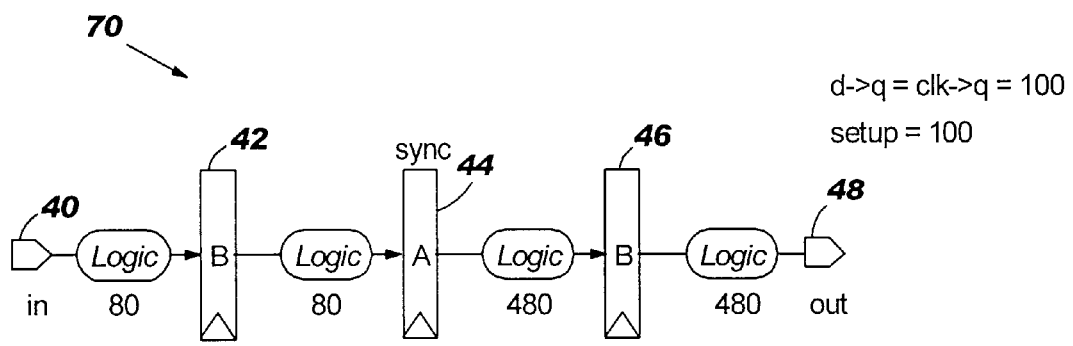
FIG. 8 is a schematic drawing of one example of a "latch" style model.
Figure 8B:
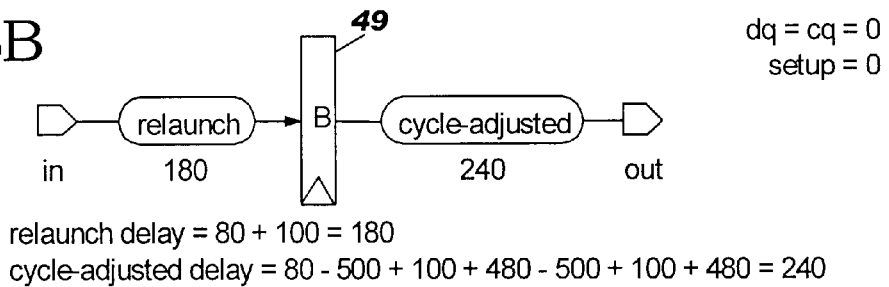

FIG. 8 shows the delay calculation. A worst case arrival time is calculated and a timing library format (TLF) delay, from clock to the output 48, is inserted. The delay in this example is 660 picoseconds when the second latch 44 is synchronous. If the third latch 46 was, instead, synchronous, the delay would only be 580 picoseconds. If the first latch 42 is synchronous, the latch path would not time borrow through the second latch 44. In the "latch" style model 70, however, the input set-up time does not have to guarantee the sync at the second latch 44. A 180 picosecond set-up time is, instead, inserted to meet the normal transparent window of all latches in the path. The set-up constraint at an input pin for the first latch 42 would be 180 picoseconds, the set-up constraint for an input to the second latch 44 would be (−140) picoseconds, and the set-up constraint for an input to the third latch 46 would be (−60) picoseconds. FIG. 8B shows an example of correctly modeling the FIG. 8A path to reflect transparency from input to output. The relaunch delay is 180 picoseconds in this example to reflect set-up to the latch 50 when the latch 50 is a sync point. The output delay is then adjusted to 240 picoseconds to reflect the situation when the latch 50 is in transparent mode.

FIG. 9 is a flowchart describing an alternative method of creating a timing model for a digital circuit. FIG. 9 demonstrates a flow diagram for a sub-block level flow. FIG. 9 shows the step of determining a delay statement (shown as Block 30 in FIG. 2), and the step of determining an input set-up constraint (shown as Block 32 in FIG. 2), may have sub-steps. The step of determining a delay statement 30, however, is the same as that shown in FIG. 4 and will not be further discussed. The set-up constraints are calculated by adding the relaunch time as discussed and shown with reference to FIG. 7 and so will also not be further discussed. The step of determining an input set-up constraint 32 is also very similar to the "psuedo-latch" style model flow shown in FIG. 4, however, the "latch" style flow includes a flow-through section 72. If the block contains a flow-through path, the VERILOG® shell is modified (Block 74) with a "perfect" latch model. The timing library format (TLF) is then modified (Block 76) with an adjusted relaunch time and with a cycle adjusted time.

Figure 10A:
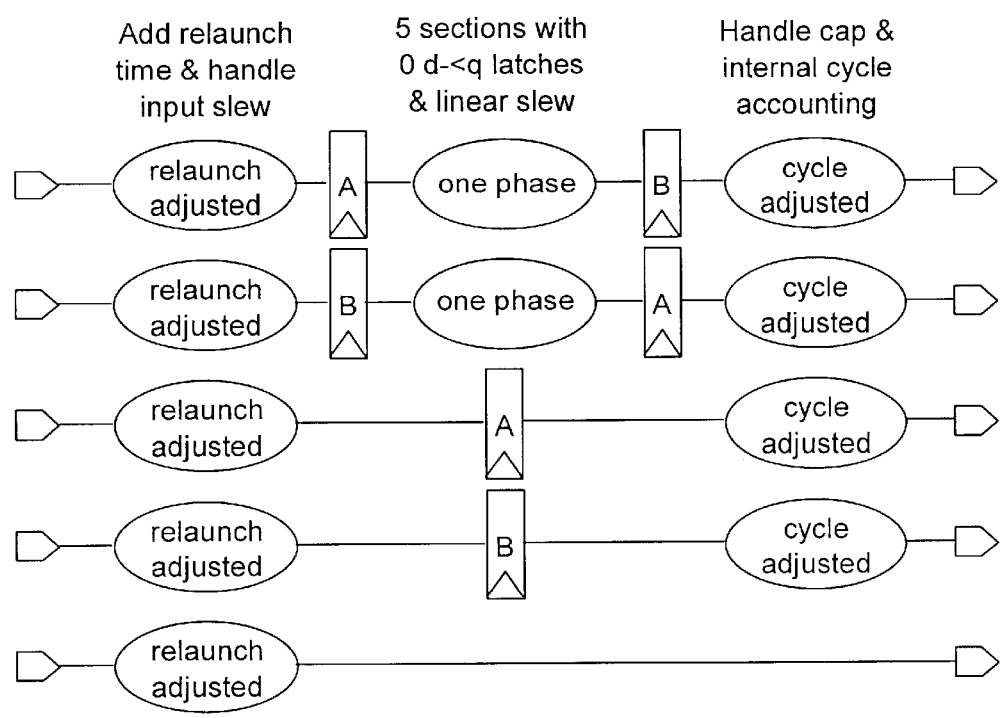
FIG. 10 is a schematic drawing further explaining FIG. 9.
Figure 10B:
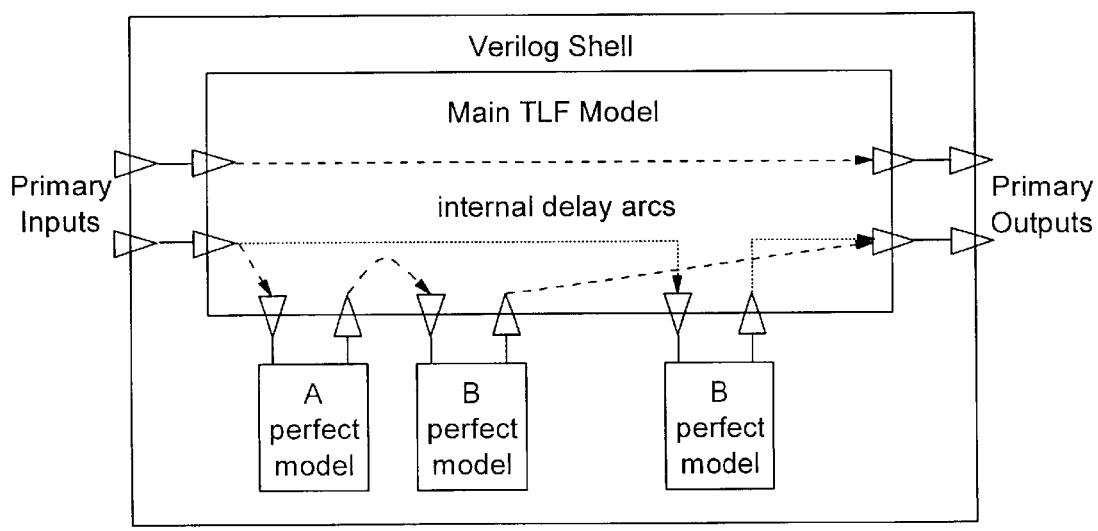

FIG. 10 is a schematic further explaining the flow-through section (shown as reference numeral 72 shown in FIG. 9). FIG. 10A shows five types of "perfect" latch model sections that may be chosen to modify the VERILOG®shell, while FIG. 10B schematically illustrates a VERILOG®shell containing a timing library format calling out the "perfect" latch model sections. The flow-through section filters constraints related to flow-through paths in the block. If the block contains a flow-through path, the VERILOG®shell is modified (shown as Block 74 in FIG. 9) with a "perfect" latch model. Flow-through paths, from every input to every output that appear in the generic static timing analyzer report, need to be included in the black box model. The challenge is handling the correct cycle accounting at the edge of the box. If a path begins with an "A" latch (e.g., a transparent latch), then the model must begin with an "A" latch. Otherwise the cycle accounting into this path may be inaccurate depending on what type of latch is driving the input. If a path ends in an "A" latch, the model output, likewise, must end in an "A" latch. This cycle accounting challenge leads to five (5) different sections for the flow-through paths: AB, BA, A, B, and combinational. These are "perfect" sections having zero (0) or one phase of delay, and these sections translate input slew to output slew. Choosing the corresponding "perfect" section for a particular flow-through path allows correct cycle accounting for an connectig block.

FIGS. 11A and 11B are a timing library format description of the "perfect" latch model sections. These model sections have zero (0) or one phase delay and linear slew. These model sections may be directly copied into the main timing library format, may be instantiated as shells (as FIG. 10B shows), or may be further boxed as individual modules. These "perfect" model sections provide a simple interface for relaunching and cycle accounting. These "perfect" model sections, however, do not have set-up and hold constraints. Output load and input slew variability are incorporated into the cycle adjusted delay arc.

We now return to the alternative method of creating a timing model shown in FIG. 9. The flow-through section 72 has filtered any constraints related to flow-through paths in the block. The VERILOG® shell has been modified (Block 74) with the "perfect" latch model. We must now modify the timing library format (TLF) with an adjusted relaunch time and with a cycle adjusted time (Block 76).

The relaunch time is calculated as described in paragraph [0035] for the "pseudo-flop" style model. Individual relaunch times are found from (time before latch)+(dq)− (time after latch). These individual relaunch times are summed for all latches and added to the delay from the input to a first latch. The slew for this section is linear.

Relaunch Adjusted Delay=(time to first latch)+(relaunch time)

The cycle adjusted time is the more complex of the two delays. The cycle adjusted time needs to incorporate the load axis delay dependency of multiple output capacitances. The cycle adjusted time also needs to include the slew adjustments for the input pin.

Cycle Adjusted Delay=(delay from last relaunch)−[(number of types of switches)×(one phase)]

The baseline for the cycle adjusted delay is from the last relaunch point to the output pin. This baseline delay must be reduced by the number of phases for each intervening latch. An intervening latch is only relevant if it switches type, e.g., from A to B or from B to A (transparent to opaque or opaque to transparent).

Figure 12A:
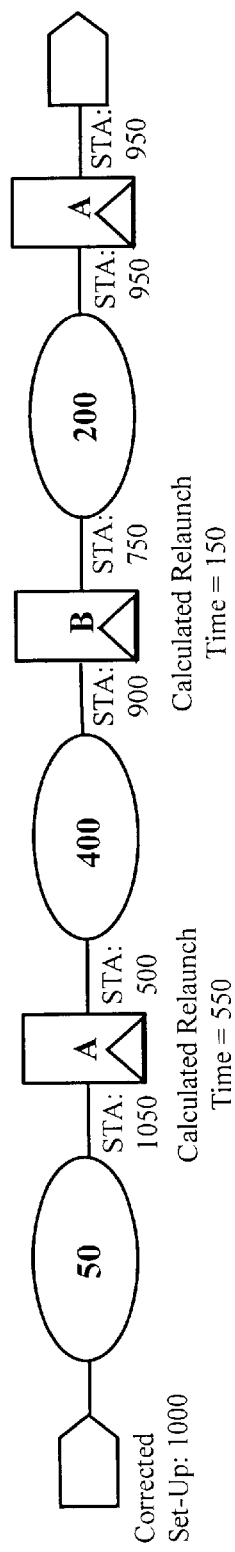
FIG. 12 is a schematic drawing showing an example of a true "latch" style model.
Figure 12B:
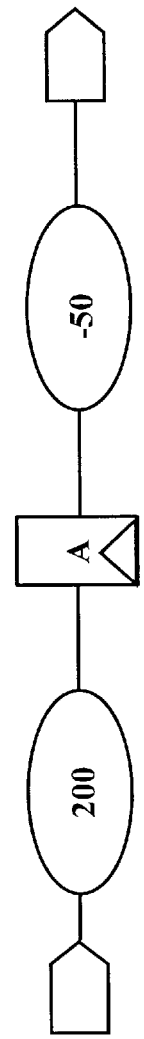

FIG. 12 is a schematic drawing showing an example of the true "latch" style model. FIG. 12A shows an actual latch path, while FIG. 12B shows a black box model of the same latch path. In the example we want to add 650 picoseconds of total delay minus one cycle for the latches (or 150 picoseconds) are added. Adding 200 picoseconds and (−50) picoseconds gives the desired 150 picoseconds of total delay. If the input arrives later than 300 picoseconds, we want to start relaunching is started. As FIG. 12A shows, relaunching starts at latch B in the actual latch path. The black box model, shown in FIG. 12B, has reset the relaunching relative to latch A.

The methods described herein may be physically embodied on or in a computer-readable medium. This computer-readable medium includes CD-ROM, DVD, tape, cassette, floppy disk, memory card, and a large-capacity disk (such as IOMEGA® ZIP®, JAZZ®, and other large-capacity memory products) (IOMEGA®, ZIP®, and JAZZ® are registered trademarks of Iomega Corporation, 1821 W. Iomega Way, Roy, Utah 84067, 801.332.1000, www.iomega.com). This computer-readable medium, or media, could be distributed to endusers, licensees, and assignees. These types of computer readable media, and other types not mentioned here but considered within the scope of the present invention, allow the methods to be easily disseminated.

While this invention has been described with respect to various features, aspects, and embodiments, those skilled and unskilled in the art will recognize the invention is not so limited. Other variations, modifications, and alternative embodiments may be made without departing from the spirit and scope of the following claims.

What is claimed is:

1. A method of creating a timing model for a digital circuit, the method comprising:
   determining a delay statement for an output of a black box model of the digital circuit; and
   determining an input set-up constraint for an input of the black box model, wherein the input set-up constraint is based at least in part upon the delay statement.

2. A method according to claim 1, wherein the step of determining the delay statement further comprises determining the delay statement related to a clocked element within the black box model.

3. A method according to claim 1, wherein the step of determining the input set-up constraint further comprises determining the input set-up constraint related to a worst case delay within the black box model.

4. A method according to claim 1, further comprising determining a delay statement for the input of the black box model.

5. A method according to claim 4, wherein the step of determining the delay statement for the input of the black box model further comprises including a latch model of a latch in the black box model.

6. A method according to claim 1, wherein the step of determining the input set-up constraint further comprises relating the input constraint to an input of a latch element within the black box model.

7. A method according to claim 1, wherein the step of determining a delay statement further comprises discouraging time borrowing.

8. A method according to claim 1, wherein the step of determining a delay statement further comprises setting an input to discourage time borrowing.

9. A method according to claim 1, wherein the step of determining a delay statement further comprises setting an output constraint to nominal.

10. A method according to claim 1, wherein the step of determining a delay statement further comprises reporting a possible violating path.

11. A method according to claim 1, wherein the step of determining a delay statement further comprises reporting a violator.

12. A method according to claim 1, wherein the step of determining an input set-up constraint further comprises basing the input set-up constraint at least in part on an output delay.

13. A method according to claim 1, wherein the step of determining an input set-up constraint further comprises determining an input arrival time.

14. A method according to claim 1, wherein the step of determining an input set-up constraint further comprises basing an output constraint on a delay.

15. A method according to claim 1, wherein the step of determining an input set-up constraint further comprises setting an output constraint to reduce an effect of input arrival time on output time.

16. A method according to claim 1, wherein the step of determining an input set-up constraint further comprises setting an input to encourage time borrowing.

17. A method according to claim 1, wherein the step of determining an input set-up constraint further comprises calculating a relaunch time.

18. A method according to claim 1, wherein the step of determining an input set-up constraint further comprises calculating a corrected constraint violation time and reordering a path based upon the corrected constraint violation time.

19. A method according to claim 1, wherein the step of determining an input set-up constraint further comprises selecting the input set-up constraint from a corrected constraint violation time.

20. A method according to claim 1, wherein the step of determining an input set-up constraint further comprises filtering constraints.

21. A method according to claim 1, wherein the step of determining an input set-up constraint further comprises including a latch model for a flow-through path.

22. A method according to claim 1, wherein the step of determining an input set-up constraint further comprises adjusting a cycle time.

23. A method of creating a timing model for a digital circuit, the method comprising:

setting an input to discourage time borrowing;

setting an output constraint to nominal;

creating a delay;

setting an input to encourage time borrowing;

setting an output constraint to reduce an effect of input arrival time on output time;

summing a relaunch time and a violation time; and selecting a input set-up constraint from a corrected constraint violation time.

24. A method of creating a black box timing model for a digital circuit, the method comprising:

allowing time borrowing into a circuit model of the digital circuit;

allowing time borrowing out of the circuit model;

allowing time borrowing on a path within the circuit model; and determining output timing independent of input arrival timing.

25. A method of creating a timing model according to claim 24, wherein the output timing depends on a synchronous path originating within the circuit model.

26. A method of creating a timing model according to claim 24, further comprising establishing an input constraint such that a slow path within the circuit model does not affect the output timing.

27. A method of creating a timing model according to claim 26, wherein the step of establishing an input constraint further comprises relating the input constraint to an input of a latch element within the circuit model.

28. A method of creating a timing model according to claim 26, wherein the step of allowing time borrowing on a path within the circuit model further comprises allowing time borrowing on a path within the circuit model, the time borrowing on the path not exceeding a worst case delay.

* * * * *

UNITED STATES PATENT AND TRADEMARK OFFICE
CERTIFICATE OF CORRECTION

PATENT NO.    : 6,701,498 B2
DATED         : March 2, 2004
INVENTOR(S)   : Matthew Becker and Chen Li Lin It is certified that error appears in the above-identified patent and that said Letters Patent is hereby corrected as shown below:

<u>Column 11,</u>
Line 23, "we want to add" should be deleted.
Line 27, "we want to start" should be deleted.

Signed and Sealed this

Fifteenth Day of June, 2004

JON W. DUDAS
*Acting Director of the United States Patent and Trademark Office*